United States Patent [19]

Ruskin

[11] Patent Number: 4,661,439

[45] Date of Patent: Apr. 28, 1987

[54] PROCESS FOR PREPARING TONERS SURFACE COATED WITH ANTISTATIC AGENT AND LIQUID SLIP AGENT

[75] Inventor: Maureen K. Ruskin, Highland Park, N.J.

[73] Assignee: E.I. De Pont de Nemours and Company, Wilmington, Del.

[21] Appl. No.: 806,165

[22] Filed: Dec. 6, 1985

[51] Int. Cl.$^4$ .................................................. G03C 5/24
[52] U.S. Cl. .................................... 430/449; 430/291; 430/331; 430/965; 430/137
[58] Field of Search ............... 430/110, 291, 331, 449, 430/965, 137; 210/186, 769, 770; 366/139, 149

[56] References Cited

U.S. PATENT DOCUMENTS

| 3,653,807 | 4/1972 | Platt | 210/769 X |
| 3,674,762 | 7/1972 | Izumo et al. | 366/139 X |
| 4,397,941 | 8/1983 | Fickes | 430/291 X |
| 4,474,473 | 10/1984 | Higuchi et al. | 366/139 X |
| 4,546,072 | 10/1985 | Matrick | 430/291 X |

FOREIGN PATENT DOCUMENTS 2628948  3/1977  Fed. Rep. of Germany ...... 210/770

Primary Examiner—Roland E. Martin

[57] ABSTRACT

Efficient, lower cost process for preparing dry, nonelectroscopic toners surface coated with antistatic agent and liquid slip agent, utilizing a pressure filter and a planetary mixer. The toners are useful for developing positive- or negative-working photosensitive elements and having imagewise tacky and nontacky surfaces.

10 Claims, No Drawings

PROCESS FOR PREPARING TONERS SURFACE COATED WITH ANTISTATIC AGENT AND LIQUID SLIP AGENT

DESCRIPTION

Technical Field

This invention relates to a process for preparing dry nonelectroscopic toners. More particularly, it relates to an improved process for preparing dry, nonelectroscopic toners comprising pigmented organic resin particles having a size distribution within the range of 0.2 to 30 micrometers, surface coated with a liquid slip agent and an antistatic agent.

Background Art

Reproduction processes are known wherein positive-working photopolymerizable elements and negative-working photosensitive elements are exposed imagewise through an original to form nontacky and tacky image areas. Positive-working photopolymerizable elements are described in Chu and Cohen, U.S. Pat. No. 3,649,268, and negative-working photosensitive elements are described in Cohen and Fan, U.S. Pat. Nos. 4,174,216 and 4,191,572. After exposure, the image is developed by toning with a suitable toner which desirably adheres only in the tacky image areas. Excess toner which may be present is removed from the nontacky areas to provide, for example, an image which is a proof of the original or which can be used to transfer the image to another surface. Multilayer proofs such as surprint or overlay proofs can be made as well.

In view of the increasing importance of proof-making in the printing industry and the problems inherent therein, improved toners and applicators for applying these toners are desirable. Some recognized improvements in nonelectroscopic toners are those described in Chu and Manger, U.S. Pat. No. 3,620,726; mixtures using these toners described in Gray, U.S. Pat. No. 3,909,282; and the toners of Manger, Fickes and Long described in U.S. Pat. No. 4,215,193. From the early use of pads dipped in toners, improved toner applicators are the subject of Sandner, U.S. Pat. No. 4,019,821 (hand operated toning) and Tobias, U.S. Pat. No. 4,069,791 (automatic toning).

Toning the tacky image areas of photosensitive elements by application of any of the above described toners has the problem that the background color resulting from the toners is difficult to completely remove from the nontacky areas of the elements. Generally an attempt is made to mechanically remove excess toner from the nontacky areas using a cloth, brush or other toner removal means. It is known that static electricity is generated by rubbing dissimilar materials together. The amount of static formed varies, depending on the nature of the material being toned and the toner removal means. For example, cleaning brushes which are close to the photosensitive element in the triboelectric table would be expected to generate a relatively low charge. It would be expected, therefore, that an acrylic brush would generate only a small charge with respect to an element that contains an acrylic compound in its photosensitive layer. The toner, however, can also generate a charge when rubbed against the brush or other cleaning means and the photosensitive element. If the toner, the cleaning means, and the element had an identical place in the triboelectric table, substantially no static charge would be generated. Such a system, while desirable, is not generally achieved. Nevertheless, removal of background color in the nontacky areas is desirable although manual cleaning is time consuming, and machine cleaning adds to overall equipment costs. Even after clean-up, however, some undesirable stain is usually present in the nontacky areas.

The term "background color" as used herein is the color present in the nontacky background areas of an exposed and toned positive-working or negative-working photosensitive element before any step is taken to remove such color. Background color is the sum of two components: "stain", which as used herein is the color which is normally not capable of being removed from the nontacky background areas despite repeated wiping, and "clean-up", which as used herein is the color which normally can be removed from the nontacky background areas, e.g., by wiping, air impingement, etc.

The dry toners of this invention are nonelectroscopic. Nonelectroscopic means that the toners are neither repelled from nor attracted to a charged rod placed in close proximity to the particles. Dry nonelectroscopic toners comprising pigmented oganic resin particles have been developed which provide good clean-up and are substantially nonstaining in the nontacky areas of the photosensitive elements used to prepare multilayer proofs. The lower propensity of these toners to stain nontacky areas and the ease with which they can be removed from such areas are largely attributed to the surface of the toner particles being coated with the combination of a slip agent and an antistatic agent, both of which are described more fully below.

For example, Fickes, U.S. Pat. No. 4,397,941, which is incorporated by reference, describes dry nonelectroscopic toner particles surface treated with at least 0.5% by weight of a slip agent, e.g., silicone oil having a weight average molecular weight of about 230 to 50,000; saturated hydrocarbons having a weight average molecular weight of about 200 to 10,000; or fluorocarbon compounds having a weight average molecular weight of about 500 to 500,000, in combination with at least 1% by weight of a defined antistatic agent.

Matrick, U.S. Pat. No. 4,546,072, which is incorporated by reference, describes dry nonelectroscopic toner particles surface coated with at least 0.1% by weight of a slip agent, e.g., silicone oil having a weight average molecular weight of about 230 to 50,000 or a fluorocarbon compound having a weight average molecular weight of 500 to 500,000, and at least 0.5% by weight of a water soluble, polymeric quaternary ammonium compound.

The standard method for preparing the toners of Fickes and Matrick has been to prepare a dry, pulverized toner, which is then surface coated to produce the final product. Both the preferred antistatic agent and the slip agent of Fickes are liquids which are applied undiluted or "neat" to the dry toner. The polymeric quaternary ammonium antistatic agents, on the other hand, are applied in aqueous solution, which results in rewetting of the toner. It has been found that rewetting the toner particles necessitates redrying and repulverization of the toner in order to avoid loss of toning quality. These addtional process steps are both time consuming and costly.

It is an object of this invention to provide an improved process for preparing dry nonelectroscopic toners surface coated with an antistatic agent and a slip agent. It is a further object of this invention to provide a process which avoids duplication of process steps, and reduces both the man hours required and the total process time. The process of the invention offers significant advantages of time, cost and efficiency for the preparation of toners coated with an antistatic agent and a slip agent. These advantages are compounded for toners coated with an antistatic agent in solution, e.g., a polymeric quaternary ammonium compound in aqueous solution, and a slip agent because of the extra process steps required if the old process is followed.

DISCLOSURE OF THE INVENTION

Brief Summary of the Invention

In accordance with this invention there is provided a process for preparing a dry, nonelectroscopic toner surface coated with a liquid slip agent and an antistatic agent, comprising the steps of:
(a) milling in a mixture of water and a suitable organic solvent a pigment and an organic resin to form a toner comprising pigmented organic resin particles having a size distribution of 0.2 to 30 micrometers.
(b) filtering said toner under pressure to form a filter cake having an organic solvent content of 1000 ppm or less.
(c) transferring said filter cake to a planetary mixer having simultaneous mixing, heating, and vacuum drying capability.
(d) in said planetary mixer, surface coating said toner with the antistatic agent and the liquid slip agent and drying to a moisture content of about 0-4%,
(e) pulverizing the dry, surface-coated toner to the desired particle size.

Detailed Description of the Invention

The dry, nonelectroscopic toners prepared by the improved process of this invention comprise pigmented organic resin particles having a size distribution within the range of 0.2 to 30 micrometers with not more than 50 percent of the particles being less than 1 micrometer particle size.

The pigmented organic resin particles are described in Chu and Manger, U.S. Pat. No. 3,620,726. Resin matrices include, e.g., polyvinyl chloride, cellulose acetate, cellulose acetate butyrate, polystyrene, and polymethyl methacrylate. Also useful are water soluble polymer matrices, e.g., polyvinyl alcohol, methyl cellulose, carboxymethyl cellulose, the particular matrix being used depending on the mechanical means of processing the toner down to the desired effective particle size distribution. For the purpose of determining whether such a particle has the preferred particle size distribution these particles can be measured, for example, by a Coulter Counter, Coulter Electronics, Inc., Hialeah, Fla. The term "particle size" as used herein with respect to the toners covers the size distribution of the smallest, independently acting unit which is called upon to discriminate between the exposed and unexposed areas of the imaging element.

The pigment portion of the toners include: Monastral ®Blue G (C.I. Pigment Blue 15, C.I. No. 74160), Toluidine Red Y (C.I. Pigment Red 3), Quindo ® Magenta (Pigment Red 122), Indo ®Brilliant Scarlet (Pigment Red 123, C.I. No. 71145), Toluidine Red B (C.I. Pigment Red 3), Watchung ®Red B (C.I. Pigment Red 48), Permanent Rubine F6B13-1731 (Pigment Red 184), Hansa ®Yellow (Pigment Yellow 98), Dalamar ®Yellow (Pigment Yellow 74, C.I. No. 11741), Toluidine Yellow G (C.I. Pigment Yellow 1), Monastral ®Blue B (C.I. Pigment Blue 15), Monastral ® Green B (C.I. Pigment Green 7), Pigment Scarlet (C.I. Pigment Red 60), Auric Brown (C.I. Pigment Brown 6), Monastral ®Green G (Pigment Green 7), Carbon Black, Sterling NS N 774 (Pigment Black 7, C.I. 77266), etc.

The pigmented organic resin particles of the invention may be made as illustrated in the examples. This method is described in greater detail in Vesce, U.S. Pat. No. 2,649,382, which is incorporated by reference. Vesce teaches a process of incorporating pigment into organic resins or plastics by milling the pigment and the organic resin in a liquid grinding medium consisting essentially of water and a water-miscible organic solvent. The resin must be at least partially soluble in the organic solvent, but the proportions of water and organic solvent must not allow substantial dissolution of the resin in the solvent mixture.

The improved clean-up and nonstaining characteristics of the toners of Fickes, U.S. Pat. No. 4,397,941, and Matrick, U.S. Pat. No. 4,546,072, are largely attributed to the surface of the toner particles being coated with the combination of a slip agent and an antistatic agent, both of which are described more fully below.

Fickes teaches a variety of antistatic agents useful for coating the surface of toner particles, including anionic, cationic, amphoteric, and nonionic antistatic agents. Useful antistatic agents include the following:
1. Sodium dodecyl benzene sulfonate,
2. Sodium alkyl sulfonate wherein the average number of carbon atoms in the alkyl chain is 18 (C14 to C22),
3. Sodium salt of acetyloleoyl sulfate,
4. Mono- and bis-alkyl phosphate wherein the alkyl is derived from a mixture of $C_8$, $C_{10}$ and $C_{12}$ straight carbon atom chains,
5. Amine salt of lauryl sulfate,
6. Alkyl trimethyl ammonium bromide wherein the alkyl chain is derived from cetyl and lauryl,
7. Quaternary ammonium compound of the formula:

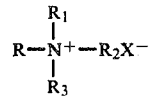

wherein R is a mixture of cetyl (27%), stearyl (30%) and oleoyl (42%) alkyl chains, $R_1$ is methyl, $R_2$ and $R_3$ are polyether substituents of the formula:

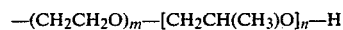

wherein m is 1 and n is 3, and X is an anion $CH_3SO_4$,
8. Alkyl bis(hydroxyethyl)-gamma-sulfopropyl betaine wherein the alkyl chain is of 16 to 18 carbon atoms ($C_{16}$ to $C_{18}$),
9. Compound of the formula:

wherein R is an alkyl chain with 12 carbon atoms and n is 4,
10. Compound of the formula:

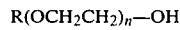

wherein R is an alkyl chain with 13 carbon atoms and n is 5.

11. Compound of the formula:

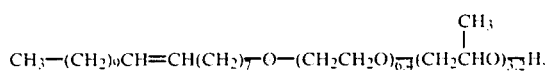

12. Mono and diglycerides of carboxylic acids having an alkyl chain derived from oleates.

13. Quaternary ammonium compound of the formula:

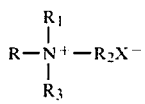

wherein R is a mixture of saturated and unsaturated $C_{16}$ to $C_{18}$ carbon atoms, $R_1$ is methyl, $R_2$ and $R_3$ are each $-(CH_2CH_2O)_m-H$, m is 8 and X is an anion $CH_3SO_4$, 14. Compound of the formula:

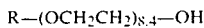

wherein R is a mixture of $C_{12}$, $C_{14}$ and $C_{16}$ alkyls,

15. Compound of the formula:

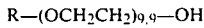

wherein R is a mixture of saturated and unsaturated $C_{16}$ to $C_{18}$ carbon atoms.

Silicone oil is the preferred slip agent and Compound 10 above is the preferred antistatic agent. The antistatic agent is present on the surface of the particulate toner in amounts of at least 1% by weight up to about 12% by weight. A preferred range for antistatic agent is 5 to 10% by weight. The slip agent is present on said toner surface in an amount of at least 0.5% by weight up to about 12% by weight. A preferred range for the slip agent is 3 to 7% by weight.

Further information concerning suitable antistatic and slip agents as well as preferred treatment levels is found at Col. 3, line 29 through Col. 6, line 5 of Fickes, U.S. Pat. No. 4,397,941, which is incorporated herein by reference.

Among the water soluble, polymeric quaternary ammonium compounds which Matrick teaches to be useful antistatic agents for treating toners, the most preferred compound is poly(dimethyl diallyl ammonium chloride). Other preferred water soluble, polymeric quaternary ammonium compounds are N,N,N-trimethyl-2-[2-methyl-1-oxo-2-propenyl)oxy]-methylsulfate homopolymer, Reten®300, Hercules Corp., Wilmington, DE; copolymer of vinyl pyrrolidone and dimethyl aminoethylmethacrylate quaternized with dimethyl sulfate; polymeric quaternary ammonium salt of hydroxyethyl cellulose reacted with a trimethyl ammonium substituted epoxide. Silicone oil is the preferred slip agent.

The polymeric quaternary ammonium compound is coated on the surface of the particulate toner in amounts of at least 0.5% by weight up to about 20% by weight. A preferred range for the polymeric quaternary ammonium compound is 3 to 12% by weight. The slip agent is coated on the toner in an amount of at least 0.1% by weight up to about 25% by weight, a preferred range being between 0.3 and 15% by weight. Further information concerning suitable polymeric quaternary ammonium compounds and slip agents as well as treatment levels is found in Matrick, U.S. Pat. No. 4,546,072, at Col. 5, line 8 through Col. 7, line 54, the disclosure of which is incorporated herein by reference.

The process of preparing the above toners as taught in Fickes, U.S. Pat. No. 4,397,941; Matrick, U.S. Pat. No. 4,546,072; and in Grubb and Matrick, U.S. Pat. No. 4,547,457, which is incorporated herein by reference, is substantially as illustrated in Example 2 (Control). The process may be summarized as follows: the pigment and an organic resin are milled in a mixture of water and a suitable organic solvent to form a toner comprising pigmented organic resin particles having a size distribution within the range of 0.2 to 30 micrometers and not more than 50 percent of the particles being less than 1 micrometer particle size. The toner-solvent mixture is then filtered using a gravity filter. With magenta toners, e.g., Quindo ®Magenta (Pigment Red 122), the resulting filter cake is reslurried with water and the slurry refiltered in the same manner. This filter cake is oven dried, and the dried filter cake is pulverized to produce a toner of the described particle size. The toner is then surface coated with an antistatic agent and a slip agent.

In general, the antistatic agent and the slip agent may be surface coated on the toner particles in either order or simultaneously. It has been found, however, that the particular blender or mixing equipment may affect the order in which the surface treatments are coated on the pigmented resin particles. For example, it is advantageous to coat a polymeric quaternary ammonium antistatic agent first, followed by the slip agent, when a Patterson Kelley Twin Shell Blender or a Hobart H-600 Mixer is used. When coating is done in a Red Devil #30, 5400 Paint Conditioner Model MKI-R, or an equivalent type of mixer, however, the slip agent and quaternary ammonium compound may be added in either order or simultaneously. After blending or mixing, the toner is generally ready for use. When the antistatic agent is an aqueous solution of a polymeric quaternary ammonium compound, however, redrying and repulverization of the coated toner are desirable to maintain optimal toning quality.

The above-described process for preparing a dry, nonelectroscopic toner surface coated with an antistatic agent and a slip agent requires from eight to ten transfer steps, approximately 27 man hours, and a total cycle time of about 100 hours.

The improved process of the invention eliminates the interim oven drying and pulverization steps. Instead, surface coating and drying are carried out in a planetary mixer having mixing, heating, and vacuum drying capability. The surface-coated, dried toner is then pulverized, e.g., in an Alpine Pin Mill or comparable device, to achieve the desired particle size. This process involves only four transfer steps, and the man hours and total cycle time required are approximately 18 and 24 hours, respectively.

The improved process of the invention is illustrated in the Examples below. The method of preparing the basic toner, i.e., pigmented resin particles of the desired size distribution, is unchanged. In the process of the invention, however, the conventional Nutsch or other comparable gravity filter is replaced by a pressure filter. Surprisingly, with certain pigments the filter cake produced by gravity filtration, which contains about 65–75% volatiles and 5–10% acetone or other organic solvent, cannot be processed according to the claimed process in a planetary mixer. In particular, a magenta filter cake obtained by gravity filtration which was surface coated and processed using heat and vacuum drying in a planetary mixer was found to give unacceptable toning quality. The final toner was off-color, grainy, and produced uneven toning. If the magenta filter cake is obtained using a pressure filter, however, so that the content of total volatiles is reduced to 58 to 62% and the acetone content to 1000 ppm or less, a good quality toner can be produced while taking advantage of the efficiencies of the planetary mixer process. The critical factor was found to be the low acetone content present in the filter cake after pressure filtration.

The filter cake is then transferred to a planetary mixer having simultaneous mixing, heating and vaccum drying capability. A planetary mixer has one or more stirring blades which revolve around the mixing vessel on a central axis, while each blade revolves simultaneously on its own axis. With each revolution on its own axis each stirrer blade advances forward along the wall of the mixing vessel. This produces highly efficient mixing action. Planetary mixers fitted with vacuum hood and heating jacket accessories permit mixing, heating, and vacuum drying to be carried out simultaneously. Use of the planetary mixer allows the wet filter cake to be surface treated, mixed and dried under heat and vacuum in a single piece of equipment and in essentially one process step, thereby reducing cycle time and eliminating time-consuming transfer steps. Although a single-blade planetary mixer may be used, a double planetary mixer, e.g., a Ross Double Planetary Mixer, Charles Ross and Son, Hauppauge, NY, or comparable device, is preferred. A double planetary mixer has two rotating blades for increased mixing efficiency. The final step in the manufacturing process is the pulverization of the dried treated toner.

Pressure filters, or "filter presses" as they are also known, comprise separate filter elements arranged horizontally and pressed together by central pressure to form a seal. The chambers formed between elements are filled with the liquid-solid suspension to be filtered. As pressure is applied filtration occurs through the media on both sides of all chambers; the filtrate runs off and a cake of solids forms on the filter media. Pressure filtration permits more intensive washing of the product with less liquid. It also produces a drier cake with more consistent moisture and organic solvent content. Most important to the claimed process, a filter cake having an organic solvent content of 1000 ppm or less is produced. A 33-plate horizontal filter press, manufactured by Eberhard Hoesch and Söhne, Duren, West Germany, Hoesch Industries, Wharton, NJ, was used in the following examples.

Use of a pressure filter significantly reduces process time as compared to standard gravity filtration methods. In particular, filtration and washing are accomplished in a single process step, and the need for reslurrying and refiltration are eliminated by using a filter press. Moreover, the filter press produces a filter cake which is drier and has a lower organic solvent content.

In general, the antistatic agent and the slip agent may be surface coated on the pigmented organic resin particles in either order or simultaneously. It has been found, however that when the antistatic agent is in solution, e.g. a polymeric quaternary ammonium compound in aqueous solution, as opposed to an antistatic agent which is a neat or diluted liquid under conditions of use, the order of addition of the antistatic agent and the slip agent may be critical. Particularly with certain pigments, e.g., Quindo ®Magenta (Pigment Red 122, Allied Chemical Corp., Harmon Colors), and to a lesser extent with phthalocyanine pigments used in making cyan toners, e.g., Monastral ®Blue G (Copper phthalocyanine, Pigment Blue 15, C.I. No. 74160), the solution of antistatic agent must be surface coated on the toner first. The antistat-coated toner is then dried to about 0-4% moisture content. Finally, the slip agent is added to the dried, antistat-coated toner and mixed until the toner is thoroughly coated with both components. If the slip agent is added before the toner is thoroughly dried, clean-up characteristics of the toner are poor, as though some displacement of antistatic agent by slip agent occurs. The filter cake may be dried in the planetary mixer to a moisture content of about 15–20% before adding antistatic agent and/or slip agent. This initial drying is, however, optional.

Drying temperatures may vary with the pigment being used. For example, with the yellow, cyan, black, and half-strength magenta toners of the invention, drying temperatures of 210°–220° F. were used, whereas full strength magenta required a somewhat lower drying temperature of 180°–190° F.

INDUSTRIAL APPLICABILITY

The dry, nonelectroscopic surface-coated toners prepared by the process of the invention are useful for development of positive- or negative-working photosensitive elements having imagewise tacky and non-tacky surfaces. The toners are particularly useful in the toning of photosensitive elements useful for the preparation of color proofs, e.g., surprints and overlays, using an automatic toning apparatus as described in Tobias, U.S. Pat. No. 4,069,791. The process of the invention also has significant industrial applicability in that it reduces the number of transfer steps as well as the total cycle time and man hours required. The result is a more efficient and lower cost process for preparation of dry, nonelectroscopic toners surface coated with an antistatic agent and a liquid slip agent.

EXAMPLES

This invention is illustrated by the following examples. Percentages are by weight.

Example 1

The following ingredients were used to prepare a full-strength magenta toner:

| INGREDIENT | AMOUNT IN GRAMS |
| --- | --- |
| Quindo ® Magenta (Pigment Red 122, Allied Chemical Corp., Harmon Colors Division, Mobay Chemical Corp., Haledon, NJ) | 12,780 |
| Indo ® Brilliant Scarlet Toner (Pigment Red 123, C.I. No. 71145) | 2,650 |
| Cellulose acetate | 20,870 |
| Acetone | 97,610 |
| Water | 79,450 |

The water and acetone were thoroughly mixed and charged to a Type 100S Attritor (Union Process Co., Akron, Ohio) with the jacket temperature maintained at 21° C. This mill contained ⅛ inch (0.049 cm) diameter.

Type 440 stainless steel balls that were agitated at 150 rpm. A nitrogen atmosphere was maintained in the attritor during the mixing procedure. Approximately two-thirds of the weight of the cellulose acetate was then added during a 3- to 5-minute period and was agitated in the liquid for about 2 minutes. The pigments were then added over a 2-minute period followed by the remainder of the cellulose acetate. The mixture was then agitated at 150 rpm in the attritor for about 6 hours. The attritor was drained and washed with water and the combined effluents were filtered to collect the wet toner using a Hoesch Filter Press with 33 plates, similar to that described in Bulletin FP-2 published by the Standard Filter Division of Hoesch Industries, Inc., Wharton, NJ. The filtering step took 4 hours, the moisture content of the filter cake was found to be 61%±2% and the acetone concentration was <500 ppm. The toner was then placed in a Ross Double Planetary Mixer, Model HDM manufactured by Charles Ross and Son Company, Hauppauge, NY. The toner was vacuum dried for 2 hours at 85° C., while being mixed at 15 rpm for 1 hour, and at 30 rpm for an additional hour to a moisture content of 15%. 7,945 g of a 20% solution of poly(dimethyl diallyl ammonium chloride), Merquat ®100, Merck Co., Rahway, NJ, were then added and the mixture mixed for 15 minutes at 15 rpm followed by vacuum drying at 85° C. for an additional 15 minutes at the same speed. The speed was then increased to 30 rpm and vacuum drying continued for 3 hours to a moisture content of 1%. 2,043 g of silicone oil, polydimethyl siloxane, were then added and the surface treated toner was again mixed for 20 minutes at 15 rpm. The so treated toner was then pulverized in an Alpine Pin Mill, type 160Z, Alpine Corp., Augsburg, W. Germany, for 2 hours with the speed set at 30.

Example 2 (Control)

A magenta toner was prepared as described above but with the following exceptions: The attritor was drained and washed with 120 gallons of water at 40° to 50° F. (4° to 10° C.) and the combined ingredients were filtered through a Nutsch 36-inch ceramic gravity filter. The filtering took 12 hours. The resulting filter cake had a 65 to 75% moisture content and an acetone concentration of 5%. The filter cake was reslurried with 110 gallons of water in a holding tank, and the slurry then filtered through a Nutsch filter along with 40 gallons of water at 40° to 50° F. (4° to 10° C.). The reslurrying took 2 hours and the refiltering 8 hours. The filter cake was then dried in a 110° C. forced air oven for 24 to 36 hours. The dried filter cake was then pulverized in an Alpine Pin Mill for 2 hours with the speed set at 60. The toner was then surface treated in a Patterson Kelley twin shell blender. 7,945 g of 20% solution of poly(-dimethyl diallyl ammonium chloride), Merquat ®100, Merck Co., Rahway, NJ, were added over a 1-2 hour period to the dried and pulverized toner and the mixture was blended for 1 hour. 2,043 grams of silicone oil, polydimethyl siloxane, were then added over a 15-30 minute period, followed by additional blending for 20 minutes. The so treated toner was then dried in a forced air oven at 110° C. for 24 hours. The dried toner was then pulverized in an Alpine Pin Mill for 2 hours with the speed set at 60.

The process time for the toners of the invention was 20 hours vs. 98 hours for the toners prepared by the conventional process.

The toners of Examples 1 and 2 were used to tone positive and negative-working photopolymerizable elements similar to those described in Example 1 of Fickes, U.S. Pat. No. 4,330,613, issued May 18, 1982. The toning was accomplished in an automatic toning device as described in Tobias U.S. Pat. No. 4,069,791. Results show that both conventional toners and toners prepared according to the process of the invention give excellent clean-up with comparable low stain.

Example 3

The following ingredients were used to prepare a yellow toner:

| INGREDIENT | AMOUNT (g) |
| --- | --- |
| Dalamar ® Yellow (Pigment Yellow 74, C.I. No. 11741) | 13,690 |
| Cellulose Acetate | 23,310 |
| Acetone | 97,610 |
| Water | 79,450 |

The toner was prepared as described in Example 1 with the following exceptions: The toner was vacuum dried at 110° C. After vacuum drying at 15 rpm for 15 minutes, the speed was increased to 30 rpm and drying continued for 2 hours. 10,896 g of 20% solution of poly(dimethyl diallyl ammonium chloride), and 4,540 g of silicone oil, polydimethylsiloxane were added instead of 7,945 g and 2,043 g respectively.

The process time for toners of the invention was 18 hours. When used to tone negative-working photopolymerizable elements, the toners had excellent clean-up, lack of stain, and aged well.

Example 4

The following ingredients were then used to make a black toner.

| INGREDIENT | AMOUNT (g) |
| --- | --- |
| Carbon Black, Sterling NS N 774 (Pigment Black 7, C.I. No. 77266) | 17,780 |
| Cellulose Acetate | 18,510 |
| Acetone | 97,610 |
| Water | 79,450 |

The toner was prepared and filtered in the manner described in Example 1. 2,270 grams of the filtered toner were then placed in a 2 gallon Ross Double Planetary Mixer, Model LDM manufactured by Charles Ross and Son, Hauppauge, NY. The toner was mixed for 20 minutes at 20 rpm, followed by vacuum drying for 4½ hours at 220° F. (104.4° C.) at the same speed to give a toner with a moisture content of 1%. The toner was cooled to 21° C. and 40 grams of silicone oil, polydimethyl siloxane, were added followed by mixing for 20 minutes at 20 rpm. 92 grams of an antistatic agent of the formula, $R(OCH_2CH_2)_n$—OH, wherein R is an alkyl chain with 13 carbon atoms and n is 5, were then added followed by mixing for 20 minutes at the same speed. The so treated toners were then pulverized in an Alpine Pin Mill, type 160Z, Alpine Corp., Augsburg, W. Germany, for 1 minute with the speed set at 22 to 24. When used to tone positive- or negative-working photopolymerizable elements, the toners of the invention gave good clean-up and lack of stain and had excellent toning quality.

I claim:

1. A process for preparing a dry, nonelectroscopic toner surface coated with a liquid slip agent and an antistatic agent, comprising the steps of:
   (a) milling in a mixture of water and a suitable organic solvent a pigment and an organic resin to form a toner comprising pigmented organic resin particles having a size distribution of 0.2 to 30 micrometers,
   (b) filtering said toner under pressure to form a filter cake having an organic solvent content of about 1000 rpm or less,
   (c) transferring said filter cake to a planetary mixer having simultaneous mixing, heating, and vacuum drying capability,
   (d) in said planetary mixer, surface coating said toner with the antistatic agent and the liquid slip agent and drying to a moisture content of about 0–4%,
   (e) pulverizing the dry, surface-coated toner to the desired particle size.

2. A process according to claim 1, wherein the antistatic agent is applied to the toner as a solution, and wherein in step (d) said solution is applied first, followed by mixing, heating and vacuum drying the antistatic agent-coated toner to a moisture content of about 0–4%, and wherein the liquid slip agent is then coated on said dry toner.

3. A process according to claim 2, wherein the antistatic agent is a water soluble, polymeric quaternary ammonium compound in aqueous solution.

4. A process according to claim 2, wherein in step (d), the toner is dried to a moisture content of about 15–20% before the solution containing the antistatic agent is added.

5. A process according to claim 3, wherein the polymeric quaternary ammonium compound is poly(dimethyl diallyl ammonium chloride).

6. A process according to claim 2, wherein the liquid slip agent is polydimethylsiloxane or polymethyl(R-)siloxane where R is an alkyl chain with 2 to 12 carbon atoms.

7. A process according to claim 1, wherein the antistatic agent is applied to the toner as a neat liquid, and wherein in step (d) the toner is first mixed, heated and vacuum dried to a moisture content of about 0–4%, and wherein the liquid antistatic agent and liquid slip agent are then coated on the dried toner in either order or simultaneously.

8. A process according to claim 7, wherein the liquid antistatic agent is a compound of the formula $R(OCH_2CH_2)_nOH$ where R is an alkyl chain with 13 carbon atoms and n is 5.

9. A process according to claim 7, wherein the liquid slip agent is polydimethylsiloxane or polymethyl(R-)siloxane where R is an alkyl chain with 2 to 12 carbon atoms.

10. A process according to claim 1, wherein the planetary mixer is a double planetary mixer.

* * * * *